United States Patent
Jo et al.

(10) Patent No.: US 11,958,758 B2
(45) Date of Patent: Apr. 16, 2024

(54) FERROMAGNETIC ELEMENT-SUBSTITUTED ROOM-TEMPERATURE MULTIFERROIC MATERIAL AND METHOD FOR MANUFACTURING SAME

(71) Applicant: UNIST(ULSAN NATIONAL INSTITUTE OF SCIENCE AND TECHNOLOGY), Ulsan (KR)

(72) Inventors: Wook Jo, Ulsan (KR); Jae Hyeon Cho, Ulsan (KR)

(73) Assignee: UNIST(ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 511 days.

(21) Appl. No.: 17/285,473

(22) PCT Filed: Aug. 5, 2019

(86) PCT No.: PCT/KR2019/009728
§ 371 (c)(1),
(2) Date: Apr. 15, 2021

(87) PCT Pub. No.: WO2020/091197
PCT Pub. Date: May 7, 2020

(65) Prior Publication Data
US 2021/0340024 A1   Nov. 4, 2021

(30) Foreign Application Priority Data
Oct. 30, 2018   (KR) ........................ 10-2018-0130821

(51) Int. Cl.
*C01G 49/00*   (2006.01)
*C01G 51/00*   (2006.01)
(Continued)

(52) U.S. Cl.
CPC ......... *C01G 49/009* (2013.01); *C01G 51/006* (2013.01); *C01G 53/006* (2013.01);
(Continued)

(58) Field of Classification Search
CPC .. C01G 49/009; C01G 51/006; C01G 53/006; H01F 1/407; C01P 2002/34; C01P 2006/42
See application file for complete search history.

(56) References Cited

U.S. PATENT DOCUMENTS

2010/0288964 A1   11/2010   Pirich et al.
2018/0057409 A1    3/2018   Rosseinsky et al.

FOREIGN PATENT DOCUMENTS

CN    103887485   *   6/2014
KR    10-2011-0023056 A   3/2011
(Continued)

OTHER PUBLICATIONS

Bochenek et al., "Influence of Cobalt Admixture on the Microstructure and Dielectric Properties of PFN Ceramics", Archives of Metallurgy and Materials, vol. 56, Iss. 4, 2011, pp. 1071-1076.*
(Continued)

*Primary Examiner* — C Melissa Koslow
(74) *Attorney, Agent, or Firm* — Revolution IP, PLLC

(57) ABSTRACT

Disclosed is a ferromagnetic element-substituted room-temperature multiferroic material having ferromagnetism and ferroelectricity at room temperature, wherein the ferromagnetic element-substituted room-temperature multiferroic material includes a compound of chemical formula 1: <chemical formula 1> $(Pb_{1-x}M_x)Fe_{1/2}Nb_{1/2}O_3$. In chemical formula 1, M represents a ferromagnetic element, and x represents a number greater than 0 and smaller than 1.

12 Claims, 11 Drawing Sheets

(51) Int. Cl.
*C01G 53/00* (2006.01)
*C04B 35/26* (2006.01)
*C04B 35/497* (2006.01)
*C04B 35/64* (2006.01)
*H01F 1/40* (2006.01)
*H10N 30/097* (2023.01)
*H10N 30/853* (2023.01)

(52) U.S. Cl.
CPC ............ *C04B 35/26* (2013.01); *C04B 35/497* (2013.01); *C04B 35/64* (2013.01); *H01F 1/407* (2013.01); *H10N 30/097* (2023.02); *H10N 30/8548* (2023.02); *C01P 2002/34* (2013.01); *C01P 2002/72* (2013.01); *C01P 2006/42* (2013.01); *C04B 2235/3251* (2013.01); *C04B 2235/3272* (2013.01); *C04B 2235/3275* (2013.01); *C04B 2235/3279* (2013.01); *C04B 2235/3296* (2013.01); *C04B 2235/658* (2013.01); *C04B 2235/661* (2013.01); *C04B 2235/768* (2013.01); *C04B 2235/96* (2013.01)

(56) References Cited

FOREIGN PATENT DOCUMENTS

| KR | 10-1122631 B1 | 3/2012 |
| KR | 10-1294785 B1 | 8/2013 |
| KR | 10-1639431 B1 | 7/2016 |
| KR | 10-2017-0128776 A | 11/2017 |

OTHER PUBLICATIONS

Ananta et al, "Fabrication of PMN and PFN Ceramics by a Two-Stage Sintering Technique", Journal of the European Ceramic Society, 19 (1999), pp. 2917-2930.*

International Search Report for PCT/KR2019/009728 dated Nov. 15, 2019 from Korean Intellectual Property Office.

Bochenek, D et al., "Influence of Cobalt Admixture On the Microstructure and Dielectric Properties of PFN Ceramics", Archives of Mettallurgy and Materials. 2011, vol. 56, Issue 4, pp. 1071-1076.

* cited by examiner

FERROMAGNETIC ELEMENT-SUBSTITUTED ROOM-TEMPERATURE MULTIFERROIC MATERIAL AND METHOD FOR MANUFACTURING SAME

TECHNICAL FIELD

The technical spirit of the present invention relates to a ferromagnetic element-substituted room-temperature multiferroic material and a method for manufacturing the same.

BACKGROUND ART

Research on a material system capable of controlling electrical properties with a magnetic field or controlling magnetic properties with an electric field and applied devices using such a material system is being actively conducted. Multiferroic materials have both ferromagnetic and ferroelectric properties in a single phase. Therefore, the electric field can change the internal magnetization of the material, and the external magnetic field can induce ferroelectric polarization. This phenomenon is known as a magnetoelectric effect, and a material exhibiting this effect is called a magnetoelectrically-coupled multiferroics. Both characteristics of the electrical and magnetic polarization have the advantage of increasing the design freedom of a device. Therefore, because the multiferroic material has both ferroelectric and ferromagnetic properties, it can be applied in various fields such as information storage media and spintronic sensors. However, in multiferroic materials according to the related art, electric polarization induced by a magnetic field occurs only at a very low temperature or when a very high magnetic field is applied at room temperature. Therefore, there is a limit to applying a multiferroic material according to the related art to the field of electromagnetic materials at room temperature.

DETAILED DESCRIPTION OF THE INVENTION

Technical Problem

The present invention provides a ferromagnetic element-substituted room-temperature multiferroic material having ferromagnetism and ferroelectricity at room temperature and a method for manufacturing the same.

However, these problems are exemplary, and the technical spirit of the present invention is not limited thereto.

Technical Solution

According to an aspect of the present invention, there is provided a ferromagnetic element-substituted room-temperature multiferroic material including a compound of the following chemical formula 1:

$(Pb_{1-x}M_x)Fe_{1/2}Nb_{1/2}O_3$, <chemical formula 1> where M represents a ferromagnetic element, and x represents a number greater than 0 and smaller than 1.

In chemical formula 1, M may include iron (Fe), nickel (Ni), or cobalt (Co).

In chemical formula 1, x may be a number greater than 0 and smaller than or equal to 0.2.

The room-temperature multiferroic material may be composed of a single phase.

The room-temperature multiferroic material may have a polycrystalline bulk shape or single crystalline shape.

The room-temperature multiferroic material may have an $ABO_3$ perovskite structure.

A material at A-site of the $ABO_3$ perovskite structure may be substituted by the ferromagnetic element so that 180-degree superexchange interaction changes to 90-degree interaction.

The room-temperature multiferroic material may have a higher saturation magnetization and a higher magnetoelectric coefficient than that of $PbFe_{1/2}Nb_{1/2}O_3$.

The room-temperature multiferroic material may have ferromagnetism and ferroelectricity.

According to another aspect of the present invention, there is provided a method for manufacturing a ferromagnetic element-substituted room-temperature multiferroic material, the method including: mixing a lead oxide, an iron oxide, a niobium oxide, and a ferromagnetic element to form a mixture; calcinating the mixture; and sintering the mixture to form a room-temperature multiferroic material, wherein the ferromagnetic element-substituted room-temperature multiferroic material includes a compound of the following chemical formula 1:

$(Pb_{1-x}M_x)Fe_{1/2}Nb_{1/2}O_3$, <chemical formula 1> where M represents a ferromagnetic element, and x represents a number greater than 0 and smaller than 1.

Between the forming of the mixture and the calcinating, the method may further include first ball-milling the mixture.

Between the calcinating of the mixture and the sintering the mixture to form a room-temperature multiferroic material, the method further include second ball-milling the mixture.

Before the sintering of the mixture to form a room-temperature multiferroic material, the method may further include pressurizing the mixture to form pellets.

The calcinating may be performed at a temperature in a range of 600° C. to 850° C. in a range of 1 hour to 6 hours.

The sintering to form a room-temperature multiferroic material may be performed at a temperature in a range of 950° C. to 1150° C. in a range of 1 hour to 16 hours.

The calcinating and the sintering to form a room-temperature multiferroic material may be performed in air or at an inert atmosphere.

The lead oxide may include PbO, the iron oxide may include $Fe_2O_3$, and the niobium oxide may include $Nb_2O_5$.

The ferromagnetic element may include at least one of iron, nickel, and cobalt.

The ferromagnetic element may be composed of at least one of $Fe_2O_3$, NiO, and $CoCO_3$.

According to another aspect of the present invention, there is provided a ferromagnetic element-substituted room-temperature multiferroic material including a compound of the following chemical formula 2:

$(A_{1-x}M_x)Q_{1/2}R_{1/2}O_3$, <chemical formula 2> where, in chemical formula 2, A includes lead (Pb), barium (Ba) or bismuth (Bi), M is a ferromagnetic element including iron (Fe), nickel (Ni), or cobalt (Co), Q includes iron (Fe), nickel (Ni), or cobalt (Co), and R includes niobium (Nb) or titanium (Ti), and x is a number greater than 0 and smaller than 1.

Effects of the Invention

According to the technical spirit of the present invention, a room-temperature multiferroic material can be formed using a lead-iron-niobium-based compound. The room temperature multiferroic material has room-temperature multiferroic properties by changing 180-degree superexchange interaction to 90-degree interaction by substituting a ferromagnetic element for lead, a material at the A-site of an $ABO_3$ perovskite structure. A saturation magnetization hysteresis loop and an electric polarization loop were measured for the lead-iron-niobium-based compound in which the A-site was substituted, at room temperature to confirm the remaining ferroelectric properties and ferromagnetic properties. When lead was substituted by nickel and cobalt, it was confirmed that it had ferroelectricity and ferromagnetic properties, and when lead was substituted by iron, it was confirmed that it had a mixture of antiferromagnetic and ferromagnetic properties together with ferroelectricity. Based on the temperature-dependent magnetic susceptibility and dielectric constant measurements, it was confirmed that the curie temperature of ferromagnetism was about 800K and the curie temperature of ferroelectricity was about 370K. The magnetoelectric voltage effect indicating coupling between ferromagnetism and ferroelectricity was confirmed in a clear shape and was found to be about 4 mV/Oe cm. Current research shows the possibility of developing a room temperature single-phase multiferroic material that is practically possible.

Here, as the superexchange interaction is controlled by composition design, ferromagnetic properties can be induced at room temperature, and can be combined with existing ferroelectric properties. This concept was exemplarily implemented in $Pb(Fe_{1/2}Nb_{1/2})O_3$ (PFN) ceramic, which is a ferroelectric lead-iron-niobium-based compound. When lead in the lead-iron-niobium-based compound is partially substituted by ferromagnetic activation materials such as nickel, cobalt, and iron, it can be induced from ferroelectricity with ferromagnetic properties having a curie temperature of 500° C. or higher, and has a magnetoelectric coupling at the level of several mV/Oe cm at room temperature. 20 at. % nickel, cobalt, and iron-substituted lead-iron-niobium compounds exhibit dielectric tunability of 797%, 1175%, and 75%, respectively, at small magnetic field strengths of 1100 Oe at each shape dependent resonance frequency. The present invention can provide a new technical foundation for implementing a single-phase multiferroic ceramic having strong coupling of ferromagnetic and ferroelectric properties capable of operating at room temperature.

The effects of the present invention have been exemplarily described, and the scope of the present invention is not limited by these effects.

MODE OF THE INVENTION

Figure 1:
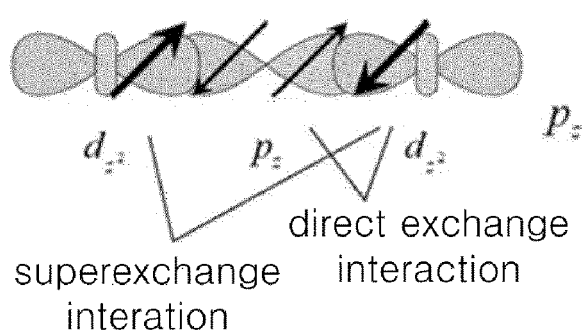
FIG. 1 is a schematic diagram for describing multiferroic characteristics of a room-temperature multiferroic material according to the technical spirit of the present invention, wherein 1(a) shows the element arrangement and interaction of the lead-iron-niobium-based compound before lead is substituted, and 1(b) shows the element arrangement and interaction after lead is substituted by a ferromagnetic material.
Figure 1:
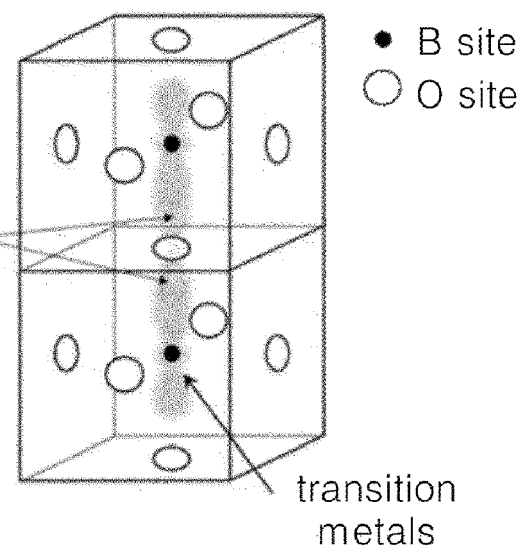
Figure 1:
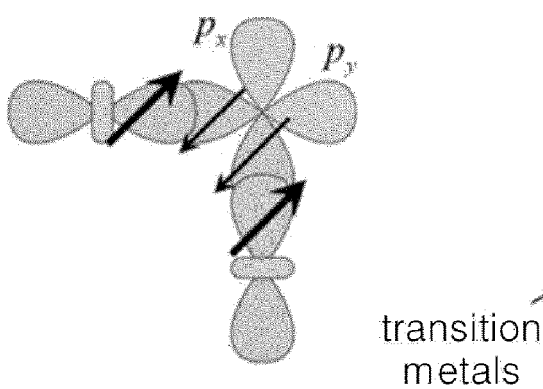
Figure 1:
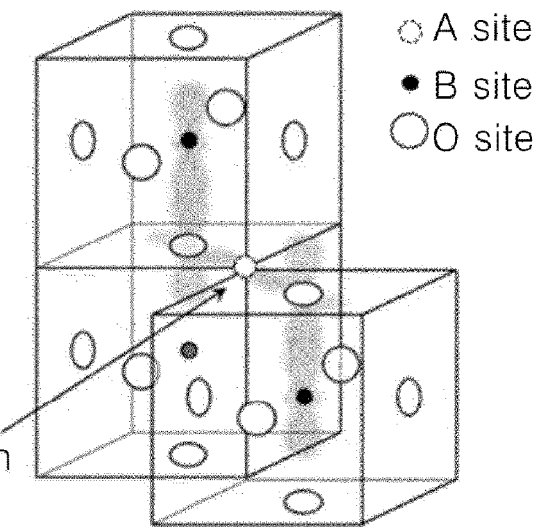

Hereinafter, exemplary embodiments of the present invention will be described below with reference to the accompanying drawings. The embodiments of the present invention are provided to more completely describe the technical spirit of the present invention to those of ordinary skill in the art, and the following embodiments may be modified in various other forms, and the scope of the technical spirit is not limited to the following embodiments.

Rather, these embodiments are provided to make the present disclosure more faithful and complete, and to completely convey the technical spirit of the present invention to those skilled in the art. In the present specification, the same reference numerals refer to the same elements. Furthermore, various elements and areas in the drawings are schematically drawn. Therefore, the technical spirit of the present invention is not limited by the relative size or distance drawn in the accompanying drawings.

A multiferroicity material may be defined as having a combination of at least two ferroic properties among ferromagnetism, ferroelectricity, and ferroelasticity. Such a multiferroicity material has been currently studied extensively due to its high potential for entirely new application opportunities based on magnetoelectric coupling. In addition, single-phase multiferroic materials having both ferroelectric and ferromagnetic order operating at room temperature have been extensively searched worldwide, expected to be used for the next-generation high-efficiency and high-density memory applications and completely new types of applications.

Nevertheless, room-temperature ferroelectric-ferromagnetic multiferroicity relevant for device applications has not been realized in a single-phase material, yet. In addition, the state of the art for room-temperature multiferroics is limited mostly to ferroelectric-antiferromagnetic, BiFeO$_3$ or some ferrimagnetic thin-film type of materials. Although the BiFeO$_3$ (BFO) has antiferromagnetic properties, it has the potential to be used as a single-phase multiferroic at room temperature, but according to recent research results, it has not yet reached the target level. That is, the BFO has not been properly synthesized in a bulk shape having very high electrical resistance. In order to realistically implement and apply such multiferroic materials, it is necessary to overcome very weak magnetic properties such as antiferromagnetic, relatively low magnetoelectric coupling, and loss of ferroelectricity. In addition, it is a more important point for commercial applications to form a multiferroic material in a bulk shape while having a single phase, but it has not been implemented yet.

It is commonly perceived that bulk multiferroic materials tend to have an antiferromagnetic order due to superexchange interaction. To overcome this challenge, recent research trends have focused on engineering the existing multiferroic materials in a way that their inherent antiferromagnetic order is forced to be altered to deliver a useful magnetization through, e.g., a canted anti-ferromagnetism, a ferrimagnetism with improper ferroelectricity, etc. This approach is conceptually right but leaves a question mark on a possible transfer of the current successes to bulk materials.

To find a breakthrough for magnetoelectric multiferroic materials that meet the contemporary desire, a compositional design in a way that a net magnetization could be induced in displacive ferroelectrics can be proposed. For example, in order for ferroelectricity to be activated, there are requirements that a high level of electrical insulation is required and that there is no inversion symmetry. It is noted that antiferromagnetism originates from the antiparallel spin configuration among B-site ions in the case of BFO. A similar but inspiring situation can be found in one of the archetypal ferromagnetic materials, representatively, NiFe$_2$O$_4$ (NFO) with an inverse spinel structure. Specifically, NFO is a ferrimagnetic insulator having an inverse spinel structure. Nevertheless, NFO is classified as soft ferromagnetic at ambient temperatures because it has a fairly high Curie temperature of about 570° C. and has excellent magnetic properties at room temperature. From this point of view, NFO is also referred to as a ferromagnetic material, and thus can be applied as a room temperature multiferroic material. NFO is a cubic oxide. Thus, the oxygen octahedron shares a corner with six neighboring octahedral oxygen octahedrons, and a surface with eight adjacent oxygen tetrahedrons. This means that the disruption of each oxygen octahedron causes a high degree of localized symmetry non-cubic distortion, and may include localized destruction in reverse symmetry. In NFO, the spin moment from Fe$^{3+}$ ions sitting in a half of the octahedral sites is completely nullified by that from the equal amount of Fe$^{3+}$ ions at the tetrahedral sites, i.e., antiferromagnetic configuration. Nevertheless, NFO is ferromagnetic (though more precisely ferrimagnetic) due to the presence of an additional ferromagnetically activation element, i.e., Ni$^{2+}$, sitting at the other half of the octahedral sites. This means that there is a high chance that a ferromagnetism can be induced even into displacive ferroelectrics such as BFO by a compositional design such as introducing additional ferromagnetic activating elements such as Ni$^{2+}$. However, it is very difficult to form the BFO material into a bulk shape having a sufficiently high electrical resistance until now.

In order to implement the multiferroic material according to the technical spirit of the present invention, a lead-iron-niobium-based compound PbFe$_{1/2}$Nb$_{1/2}$O$_3$ (PFN) was selected, and the compound further includes an active element having ferromagnetic properties by substitution. Specifically, the multiferroic material according to the technical spirit of the present invention is a lead-iron-niobium-based compound in which lead sitting at the A-site is substituted by ferromagnetic elements such as nickel, cobalt, or iron.

As used herein, "room temperature" refers to a typical room temperature and means that the temperature is not intentionally raised or lowered. Specifically, the room temperature may refer to a temperature in the range of 0° C. to 40° C., for example, and may refer to a temperature in the range of 20° C. to 30° C., for example.

FIG. 1 is a schematic diagram for describing multiferroic characteristics of a room-temperature multiferroic material according to the technical spirit of the present invention.

Referring to FIG. 1, (a) shows the element arrangement and interaction of the lead-iron-niobium-based compound before lead is substituted, and (b) shows the element arrangement and interaction after lead is substituted by a ferromagnetic material. The lead-iron-niobium-based compound is known to have a displacive ferroelectric property with a Curie temperature of about 380 K, and can be transformed into a multiferroic state in which an antiferromagnetic arrangement appears below 150 K. As shown in (a) of FIG. 1, the antiferromagnetism of PFN is established due to the 180-degree superexchange interaction between two next-to-nearest B-site Fe$^{3+}$ ions through oxygen ions in a magnetic field. Both the ferroelectricity and antiferromagnetism in PFN share the same mechanism with those in BFO.

When transition elements, i.e., conventional ferromagnetic elements such as iron, cobalt, and nickel are substituted at the A-site based on a material having an ABO$_3$ perovskite structure, which has ferroelectric and antiferromagnetic properties, for example, lead-iron-niobium-based compounds, ferromagnetic properties can be induced while maintaining ferroelectricity. That is, as shown in (b) of FIG. 1, it is possible to transform a 180-degree superexchange interaction into a 90-degree interaction. When the superexchange interaction is coupled by 180 degrees, magnetic moments are offset to each other to have antiferromagnetic properties, but when the superexchange interaction is coupled by 90 degrees, the magnetic moments are aligned in the same direction and have ferroelectric properties. As described above, the lead-iron-niobium-based compound substituted at the A-site was measured at room temperature by measuring a saturation magnetization hysteresis loop and an electric polarization loop to confirm the remaining ferroelectric properties as well as ferromagnetic properties. The curie temperature of each ferromagnetism and ferroelectricity was confirmed at about 370K and about 800K based on temperature-dependent magnetization and dielectric permittivity measurements. The magnetoelectric voltage effect, representing the coupling between ferromagnetism and ferroelectricity, was confirmed as clear shape and value of about 4 mV/Oe cm.

Figure 2:
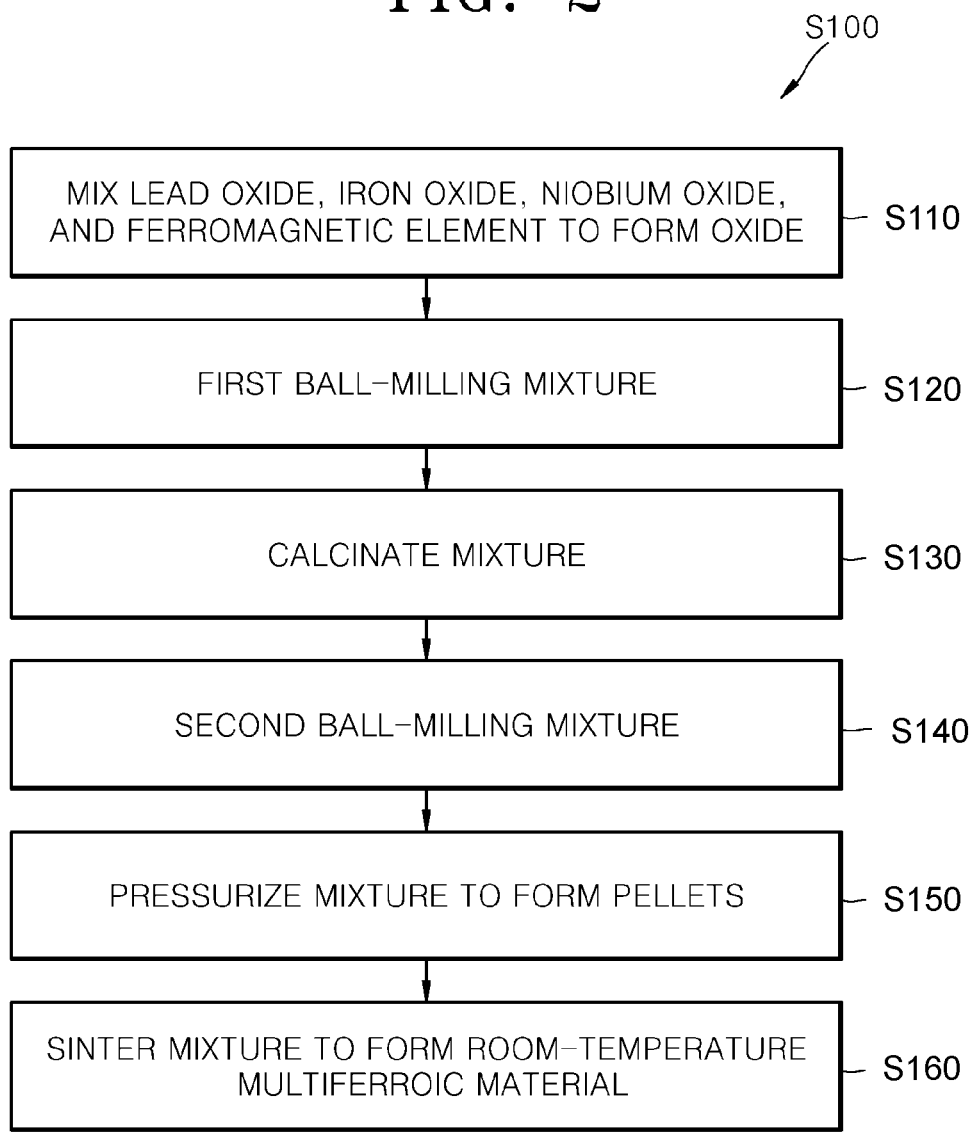
FIG. 2 is a flowchart showing a method of manufacturing a room-temperature multiferroic material according to the technical spirit of the present invention.

FIG. 2 is a flowchart showing a method (S100) for manufacturing a room-temperature multiferroic material according to the technical spirit of the present invention.

Referring to FIG. 2, the method (S100) for manufacturing a room-temperature multiferroic material includes forming a mixture by mixing lead oxide, iron oxide, niobium oxide, and a ferromagnetic element (S110); first ball-milling the mixture (S120); calcinating the mixture (S130); second ball-milling the mixture (S140); pressurizing the mixture to form pellets (S150); and sintering the mixture to form a room-temperature multiferroic material (S160).

The lead oxide may include PbO, the iron oxide may include $Fe_2O_3$, and the niobium oxide may include $Nb_2O_5$. The amount of the lead oxide, the iron oxide, and the niobium oxide may be determined according to the desired chemical composition of the final multiferroic material.

The ferromagnetic element may include at least one of iron, nickel, and cobalt. The iron may include iron oxide, for example, may include $Fe_2O_3$. The nickel may include nickel oxide, for example, NiO. The cobalt may include cobalt oxide, for example, $CoCO_3$.

The first ball-milling operation (S120) may be performed using deionized water and zirconia balls. The first ball-milling operation (S120) may be performed, for example, at a temperature in the range of 20° C. to 30° C., for example, in the range of 1 hour to 5 hours. The first ball-milling operation (S120) may be performed, for example, at a temperature of 25° C. for 3 hours.

The calcinating operation (S130) may be performed at, for example, a temperature in the range of 600° C. to 850° C., for example, in the range of 1 hour to 6 hours.

The second ball-milling operation (S140) may be performed using deionized water and zirconia balls. The second ball-milling operation (S140) may be performed at, for example, a temperature in the range of 20° C. to 30° C., for example, for 5 hours to 15 hours. The second ball-milling operation (S140) may be performed for 12 hours at a temperature of, for example, 25° C.

In the forming of pellets (S150), 0.5 g may be formed under a weight of 2 tons.

The sintering to form a room-temperature multiferroic material (S160) may be performed, for example, at a temperature in the range of 950° C. to 1150° C., for example, for 1 hour to 16 hours.

Each of the above operations may be performed in air, or may be performed in an inert atmosphere.

A room-temperature multiferroic material including the compound of Formula 1 below may be formed by using the method (S100) for manufacturing a room-temperature multiferroic material described above.

$$(Pb_{1-x}M_x)Fe_{1/2}Nb_{1/2}O_3 \qquad \text{<Formula 1>}$$

In Formula 1, M is a ferromagnetic element, and x is a number greater than 0 and smaller than 1.

In Formula 1, M may include iron, nickel, or cobalt. In Formula 1, x may be a number greater than 0 and smaller than or equal to 0.2. However, this range is exemplary and the technical spirit of the present invention is not limited thereto.

The room-temperature multiferroic material may be composed of a single phase. The meaning of being composed of a single phase means that it is composed of one phase and is not separated into two or more phases, and may have a single crystalline or polycrystalline structure in terms of a crystal structure. The room-temperature multiferroic material may have a polycrystalline bulk shape or a single crystalline shape. The room-temperature multiferroic material may have an $ABO_3$ perovskite structure. When the ferromagnetic element replaces the substance at the A-site of the $ABO_3$ perovskite structure, the 180-degree superexchange interaction can be changed to the 90-degree interaction.

The room-temperature multiferroic material may have a higher saturation magnetization and a higher magnetoelectric coefficient than that of $PbFe_{1/2}Nb_{1/2}O_3$. The room-temperature multiferroic material may have ferromagnetic properties and ferroelectric properties.

The technical spirit of the present invention is not limited to the above-described manufacturing method and the room-temperature multiferroic material manufactured thereby, but may be extended to a material having ferromagnetic properties and ferroelectricity at room temperature.

A room-temperature multiferroic material including the compound of chemical formula 2 below may be formed by using the method (S100) for manufacturing a room-temperature multiferroic material described above.

$$(A_{1-x}M_x)Q_{1/2}R_{1/2}O_3 \qquad \text{<chemical formula 2>}$$

In chemical formula 2, A includes lead (Pb), barium (Ba) or bismuth (Bi), and M is a ferromagnetic element including iron (Fe), nickel (Ni), or cobalt (Co), wherein Q includes iron (Fe), nickel (Ni), or cobalt (Co), and R includes niobium (Nb) or titanium (Ti), and x is a number greater than 0 and smaller than 1. However, this range is exemplary and the technical spirit of the present invention is not limited thereto.

The room-temperature multiferroic material formed using the above-described method (S100) for manufacturing a room-temperature multiferroic material may include $(Pb_{1-x}Fe_x)Fe_{1/2}Nb_{1/2}O_3$, $(Pb_{1-x}Fe_x)Ni_{1/2}Nb_{1/2}O_3$, $(Pb_{1-x}Fe_x)Co_{1/2}Nb_{1/2}O_3$, $(Pb_{1-x}Ni_x)Fe_{1/2}Nb_{1/2}O_3$, $(Pb_{1-x}Ni_x)Ni_{1/2}Nb_{1/2}O_3$, $(Pb_{1-x}Ni_x)Co_{1/2}Nb_{1/2}O_3$, $(Pb_{1-x}Co_x)Fe_{1/2}Nb_{1/2}O_3$, $(Pb_{1-x}Co_x)Ni_{1/2}Nb_{1/2}O_3$, $(Pb_{1-x}Co_x)Co_{1/2}Nb_{1/2}O_3$, $(Pb_{1-x}Fe_x)Fe_{1/2}Ti_{1/2}O_3$, $(Pb_{1-x}Fe_x)Ni_{1/2}Ti_{1/2}O_3$, $(Pb_{1-x}Fe_x)Co_{1/2}Ti_{1/2}O_3$, $(Pb_{1-x}Ni_x)Fe_{1/2}Ti_{1/2}O_3$, $(Pb_{1-x}Ni_x)Ni_{1/2}Ti_{1/2}O_3$, $(Pb_{1-x}Ni_x)Co_{1/2}Ti_{1/2}O_3$, $(Pb_{1-x}Co_x)Fe_{1/2}Ti_{1/2}O_3$, $(Pb_{1-x}Co_x)Ni_{1/2}Ti_{1/2}O_3$, $(Pb_{1-x}Co_x)Co_{1/2}Ti_{1/2}O_3$, $(Bi_{1-x}Fe_x)Fe_{1/2}Nb_{1/2}O_3$, $(Bi_{1-x}Fe_x)Ni_{1/2}Nb_{1/2}O_3$, $(Bi_{1-x}Fe_x)Co_{1/2}Nb_{1/2}O_3$, $(Bi_{1-x}Ni_x)Fe_{1/2}Nb_{1/2}O_3$, $(Bi_{1-x}Ni_x)Ni_{1/2}Nb_{1/2}O_3$, $(Bi_{1-x}Ni_x)Co_{1/2}Nb_{1/2}O_3$, $(Bi_{1-x}Co_x)Fe_{1/2}Nb_{1/2}O_3$, $(Bi_{1-x}Co_x)Ni_{1/2}Nb_{1/2}O_3$, $(Bi_{1-x}Co_x)Co_{1/2}Nb_{1/2}O_3$, $(Bi_{1-x}Fe_x)Fe_{1/2}Ti_{1/2}O_3$, $(Bi_{1-x}Fe_x)Ni_{1/2}Ti_{1/2}O_3$, $(Bi_{1-x}Fe_x)Co_{1/2}Ti_{1/2}O_3$, $(Bi_{1-x}Ni_x)Fe_{1/2}Ti_{1/2}O_3$, $(Bi_{1-x}Ni_x)Ni_{1/2}Ti_{1/2}O_3$, $(Bi_{1-x}Ni_x)Co_{1/2}Ti_{1/2}O_3$, $(Bi_{1-x}Co_x)Fe_{1/2}Ti_{1/2}O_3$, $(Bi_{1-x}Co_x)Ni_{1/2}Ti_{1/2}O_3$, or $(Bi_{1-x}Co_x)Co_{1/2}Ti_{1/2}O_3$.

Experimental Example

Manufacturing of Room-Temperature Multiferroic Material

A lead-iron-niobium-based compound in which the bulk-type A-site is substituted with a ferromagnetic element, was formed as a room-temperature multiferroic material using the above-described method (S100) for manufacturing a room-temperature multiferroic material.

PbO (99.9%, Sigma-Aldrich), $Fe_2O_3$ (99%, Sigma-Aldrich), $Nb_2O_5$ (99.99%, Sigma-Aldrich), NiO (99.8%, Sigma-Aldrich) and $CoCO_3$ (99.5%, Alfa-Aesar) were prepared as powders, and dried at 100° C. for 24 hours. The powders were weighed in a desired chemical composition, and bulk pellet samples were prepared using a conventional solid state sintering method. Specifically, the first ball-milling operation (S120) was performed at a temperature of 25° C. for 3 hours. The calcinating operation (S130) was performed for 2 hours at a temperature of 800° C. The second ball-milling operation (S140) was performed for 12 hours at a temperature of 25° C. In the forming of pellets (S150), 0.5 g was formed under the weight of 2 tons. The sintering to form a room-temperature multiferroic material (S160) was performed at a temperature of 1100° C. for 2 hours.

Method for Measuring Properties of Room-Temperature Multiferroic Material

In order to analyze the crystal structure of the room-temperature multiferroic material, X-ray diffraction (XRD, D/MAX2500V/PC, Rigaku) measurement was performed, and Cu-K$\alpha$ radiation, a 28 range of 20 degrees to 80 degrees, and a step size of 0.02 degrees were used.

In order to analyze the ferromagnetic properties and the magnetic curie temperature of the room-temperature multiferroic material, a magnetic hysteresis loop was measured using a vibration sample magnetism meter (VSM, VSM7300) and a physical property measurement system (PPMS, Quantum Design). The magnetic field level was smaller than 10000 Oe.

The magnetoelectric coupling effect of the room-temperature multiferroic material was analyzed. Prior to the magnetoelectric measurement, the PFN bulk samples with the composition were DC polarized for 20 minutes at 1 kV/mm at room temperature. To measure the magnetoelectric coefficient, a lock-in amplifier (SR850) a bipolar amplifier (BA4825), a DC current amplifier (BOP 36-12ML), a DC electromagnet, and a Helmholtz coils were used. The voltage change in response to a sinusoidal alternating magnetic field of 1 Oe at 1 kHz induced by the Helmholtz coil was measured every 0.1 seconds, and the alternating magnetic field has a uniform magnetic field loading/unloading speed and was swept for two consecutive cycles.

In order to analyze the ferroelectricity of the room-temperature multiferroic material, polarization and strain hysteresis loops were measured using a piezoelectric measurement system (aixACCT aixPES, Aachen, Germany). The specimen used for the measurement had a disk shape having a thickness of 1 mm and a diameter of 10 mm, and was measured at a magnetic field strength of 2.5 kV/mm at a measurement frequency of 10 Hz. The piezoelectric coefficient (d33) was measured using a d33 measuring instrument (YE2730A) at a frequency of 110 Hz. Temperature-dependent permittivity and dielectric loss were measured using an impedance meter (HP4192A).

The dielectric constant of the room-temperature multiferroic material was measured using an impedance analyzer (HP4192A) in the measurement frequency range of 100 Hz to 40 MHz at room temperature. For dielectric measurements under a magnetic field, wired disk-shaped specimens were placed parallel to the center of two flat neodymium magnets having dimensions of 40 mm×60 mm×15 mm with a separation distance of 60 mm.

The magnetic hysteresis loop of the room-temperature multiferroic material was measured using a vibration sample magnetometer (VSM, VSM7300, LakeShore Cryotronics) and a physical property measurement system (PPMS, Quantum Design).

Analysis of Properties of Room-Temperature Multiferroic Material

Table 1 is a table showing a room-temperature multiferroic material according to an embodiment of the present invention.

TABLE 1

| | Abbreviation | Chemical composition | Substitute material and mol ratio |
|---|---|---|---|
| Comparative example (pristine) | PFN | $PbFe_{1/2}Nb_{1/2}O_3$ | None |
| First embodiment | PFFN10 | $(Pb_{0.9}Fe_{0.1})Fe_{1/2}Nb_{1/2}O_3$ | Fe, 10 mol % |
| Second embodiment | PFFN20 | $(Pb_{0.8}Fe_{0.2})Fe_{1/2}Nb_{1/2}O_3$ | Fe, 20 mol % |
| Third embodiment | PNFN10 | $(Pb_{0.9}Ni_{0.1})Fe_{1/2}Nb_{1/2}O_3$ | Ni, 10 mol % |
| Fourth embodiment | PNFN20 | $(Pb_{0.8}Ni_{0.2})Fe_{1/2}Nb_{1/2}O_3$ | Ni, 20 mol % |
| Fifth embodiment | PCFN10 | $(Pb_{0.9}Co_{0.1})Fe_{1/2}Nb_{1/2}O_3$ | Co, 10 mol % |
| Sixth embodiment | PCFN20 | $(Pb_{0.8}Co_{0.2})Fe_{1/2}Nb_{1/2}O_3$ | Co, 20 mol % |

Figure 3:
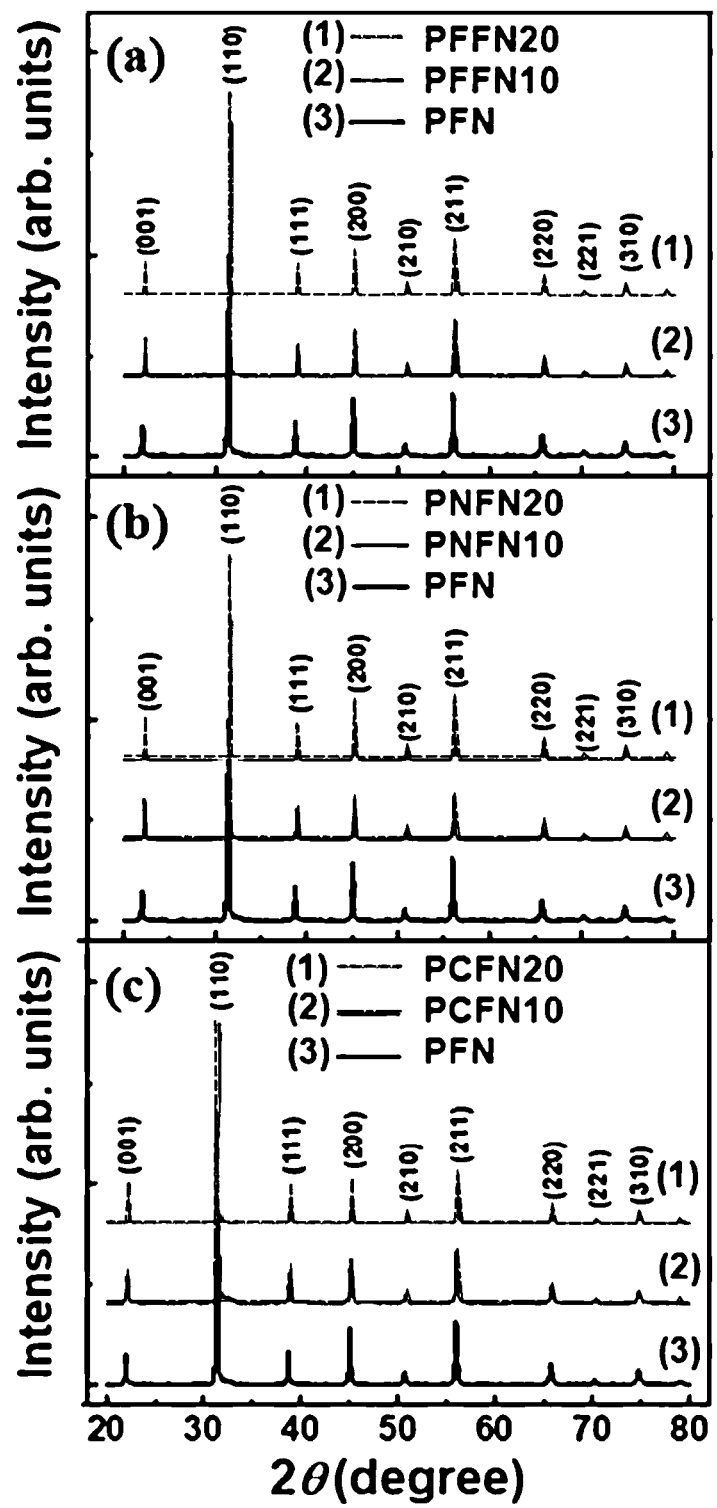
FIG. 3 is a graph showing an X-ray diffraction pattern of a room-temperature multiferroic material according to an embodiment of the present invention, wherein 3(a) is a case where lead is substituted with iron, 3(b) is a case where lead is substituted with nickel, and 3(c) is a case where lead is substituted with cobalt.

FIG. 3 is a graph showing an X-ray diffraction pattern of a room-temperature multiferroic material according to an embodiment of the present invention. In FIG. 3, (a) is a case where lead is substituted with iron, (b) is a case where lead is substituted with nickel, and (c) is a case where lead is substituted with cobalt.

Referring to FIG. 3, an X-ray diffraction pattern of a lead-iron-niobium-based compound in which the bulk-type A-site is substituted with a ferromagnetic element as the room temperature multiferroic material, is shown. Peaks appear at the same angle in all samples, and no particular peak occurs. Therefore, in the lead-iron-niobium-based compound, even if lead at the A-site is substituted with a ferromagnetic element such as iron, nickel, and cobalt, the same single phase does not appear until the ferromagnetic element is substituted at least 20 mol % with respect to lead. It can be seen that the perovskite structure on the top can be maintained. This indicates that the level of substitution introduced is excellent within the limits of the structural resistance of the original structure. However, it was shown that the lattice constant decreased as the degree of substitution with ferromagnetic elements increased.

Figure 4:
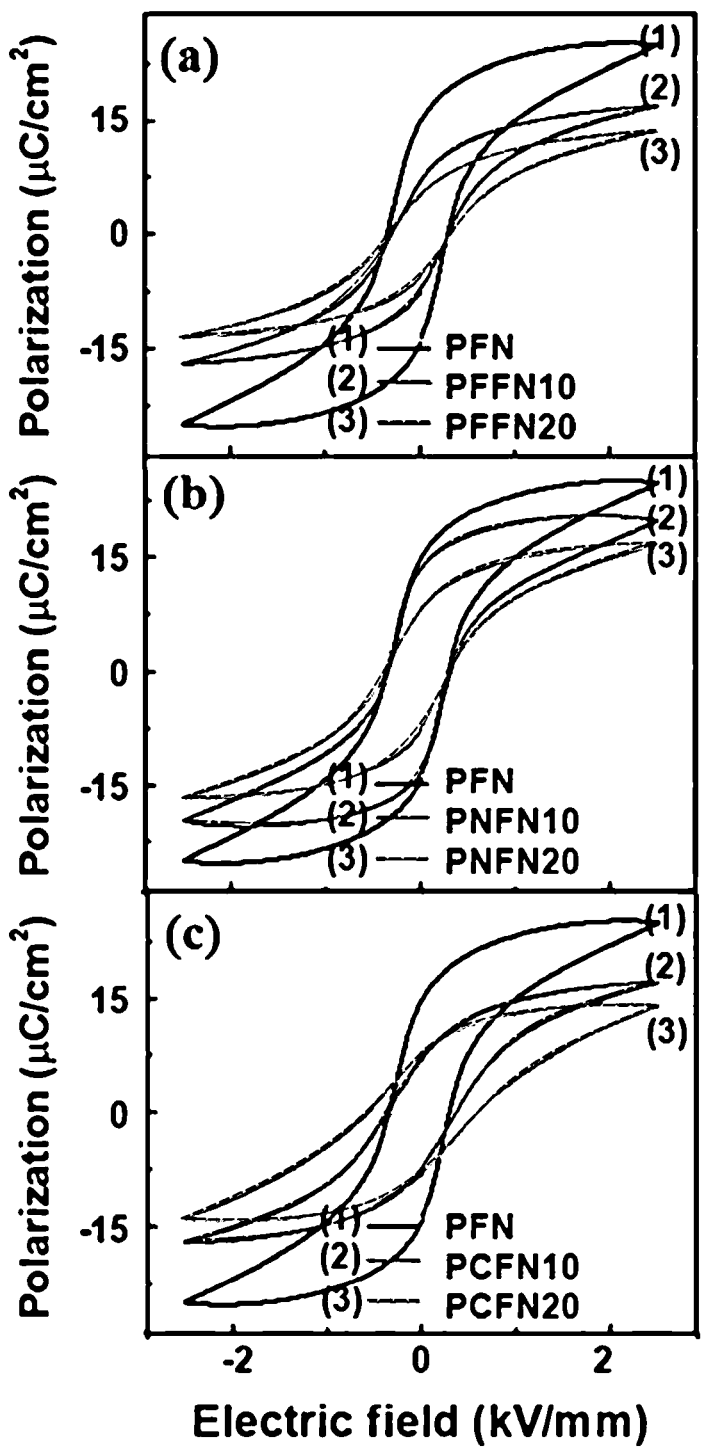
FIG. 4 is a graph showing ferroelectric properties of a room-temperature multiferroic material according to an embodiment of the present invention, wherein 4(a) is a case where lead is substituted with iron, 4(b) is a case where lead is substituted with nickel, and 4(c) is a case where lead is substituted with cobalt.

FIG. 4 is a graph showing ferroelectric properties of a room-temperature multiferroic material according to an embodiment of the present invention. In FIG. 4, (a) is a case where lead is substituted with iron, (b) is a case where lead is substituted with nickel, and (c) is a case where lead is substituted with cobalt.

Referring to FIG. 4, as a result of applying an electric field ranging from −2.5 kV/mm to +2.5 kV/mm to a lead-iron-niobium-based compound at a measurement frequency of 10 Hz, in a bulk-sized lead-iron-niobium-based compound for all compositions, a sufficiently saturated polarization hysteresis loop appeared in the bulk size at room temperature, and also the electrical polarization of typical ferroelectric properties was clearly shown. In addition, there was no sudden change in coercivity in the lead-iron-niobium-based compound before substitution and the lead-iron-niobium-based compound respectively substituted with iron or nickel, and some changes were observed in the case of cobalt. On the other hand, as the substitution of ferromagnetic elements increased, the maximum electric polarization value and the residual maximum electric polarization value tended to decrease. The lead-iron-niobium-based compound before substitution had an electric polarization value of 25 µC/cm². The electric polarization value is 16.5 µC/cm² at 10 mol % (PFFN10) and 13 µC/cm² at 20 mol % (PFFN20) when substituted with iron, and 10 mol % (PNFN10) at 20 µC/when substituted with nickel. It was 16.5 µC/cm² in cm² and 20 mol % (PNFN20), and when substituted with cobalt, it was 17 µC/cm² in 10 mol % (PCFN10) and 14 µC/cm² in 20 mol % (PCFN20).

Figure 5:
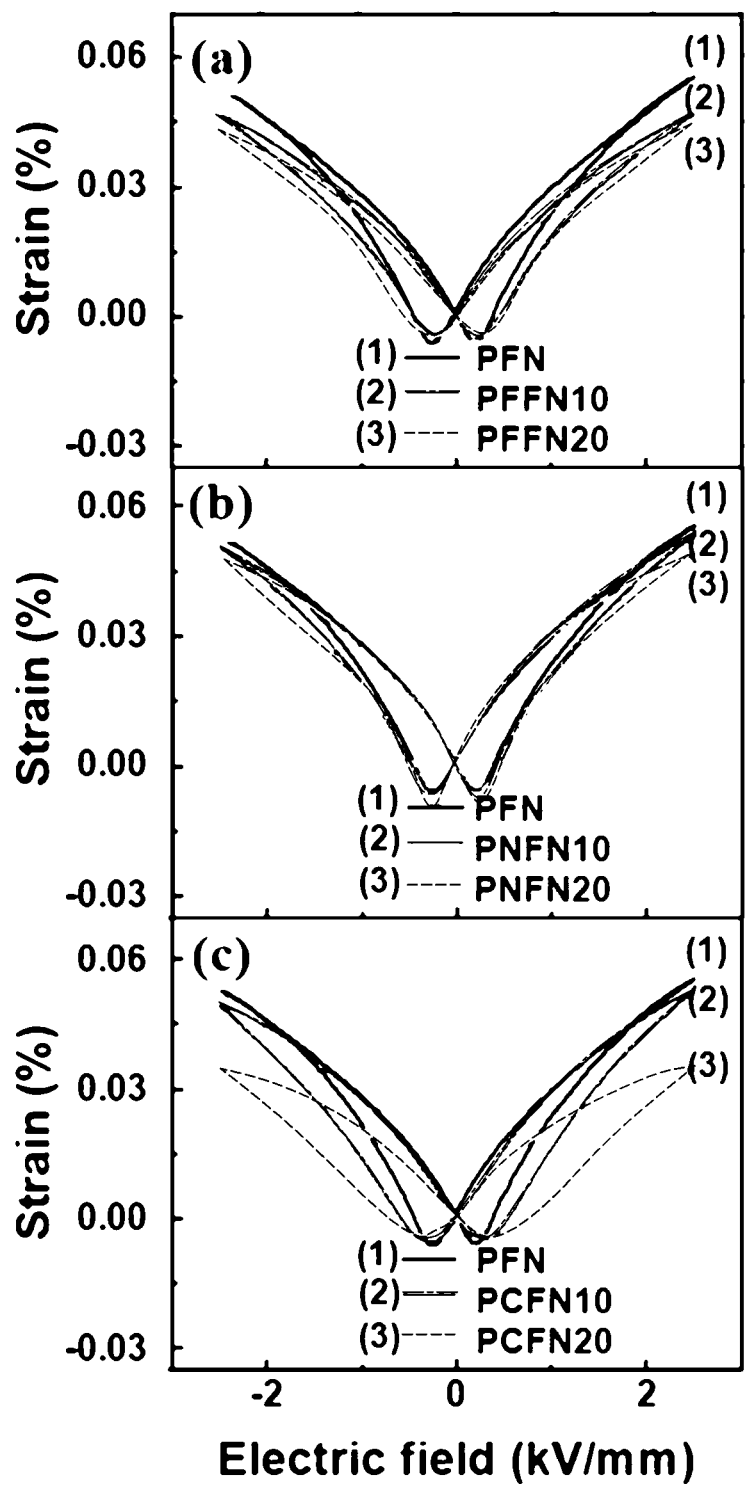
FIG. 5 is a graph showing electrical strain characteristics of a room-temperature multiferroic material according to an embodiment of the present invention, wherein 5(a) is a case where lead is substituted with iron, 5(b) is a case where lead is substituted with nickel, and 5(c) is a case where lead is substituted with cobalt.

FIG. 5 is a graph showing electrical strain characteristics of a room-temperature multiferroic material according to an embodiment of the present invention. In FIG. 5, (a) is a case where lead is substituted with iron, (b) is a case where lead is substituted with nickel, and (c) is a case where lead is substituted with cobalt.

Referring to FIG. 5, as a result of applying an electric field in the range of −2.5 kV/mm to +2.5 kV/mm to the lead-iron-niobium-based compound, in the bulk-sized lead-iron-niobium-based compound for all compositions, the electrical strain hysteresis of typical ferroelectric properties was clearly shown as a butterfly shape. In addition, as the substitution of ferromagnetic elements increased, the value of the electrical strain decreased. $S_{max}/E_{max}$, a useful property for high-stroke piezoelectric applications, was 180 pm/V at 2.5 kV/mm, regardless of the substitution material or composition, except for PCFN20. Interestingly, the piezoelectric coefficient ($d_{33}$) was measured almost similarly, about 120 µC/N.

Figure 6:
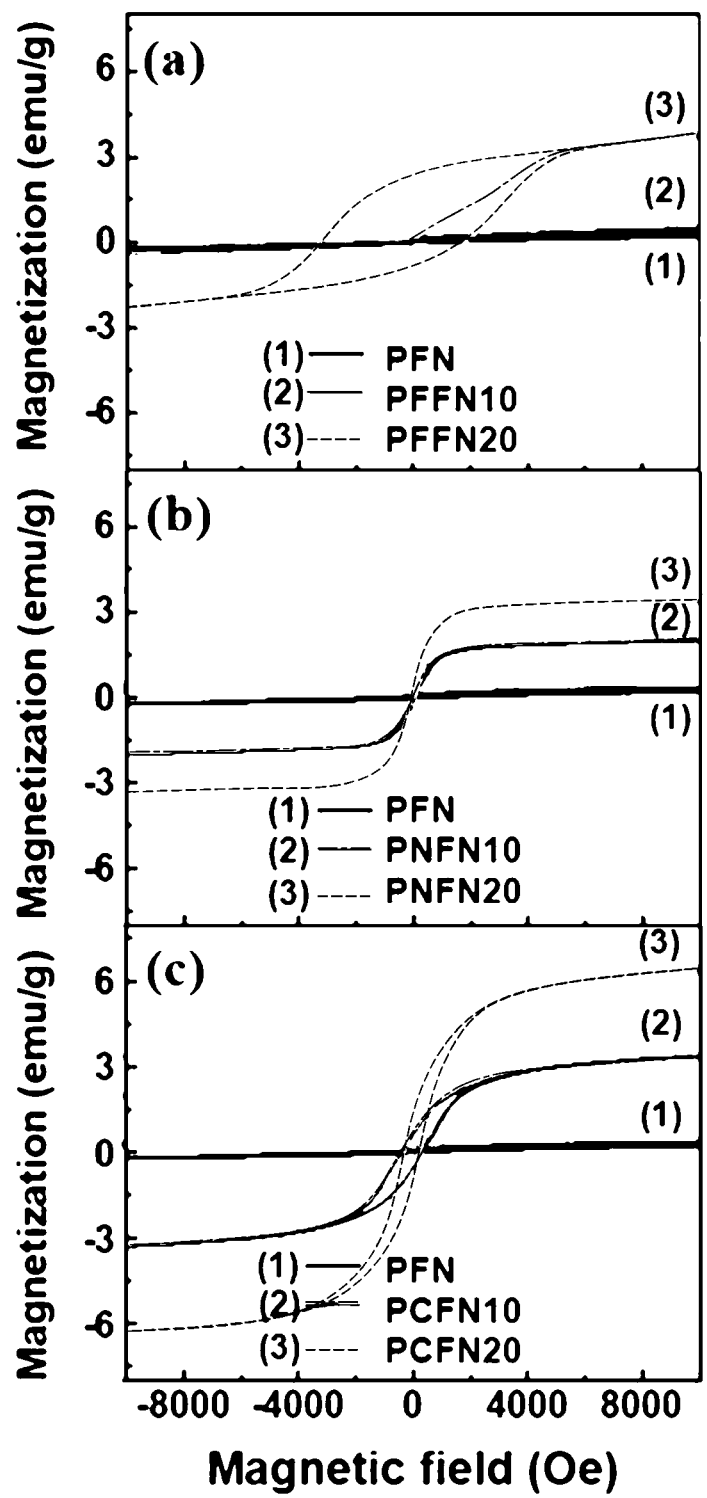
FIG. 6 is a graph showing magnetic properties of a room-temperature multiferroic material according to an embodiment of the present invention, wherein 6(a) is a case where lead is substituted with iron, 6(b) is a case where lead is substituted with nickel, and 6(c) is a case where lead is substituted with cobalt.

FIG. 6 is a graph showing magnetic properties of a multiferroic material at room temperature according to an embodiment of the present invention. In FIG. 6, (a) is a case where lead is substituted with iron, (b) is a case where lead is substituted with nickel, and (c) is a case where lead is substituted with cobalt.

Referring to FIG. 6, as a result of applying a magnetic field in the range of −10000 Oe to +10000 Oe to the lead-iron-niobium-based compound, in the lead-iron-niobium-based compounds each substituted with iron, nickel and cobalt, as a ferromagnetic hysteresis loop appeared, magnetic properties changed from antiferromagnetic to ferromagnetic properties. The lead-iron-niobium-based compound before the ferromagnetic material is substituted, exhibits a linear paramagnetic behavior, whereas the ferromagnetic material exhibits a typical ferromagnetic hysteresis loop having saturation after being substituted with nickel or cobalt in the ferromagnetic material. Changes in coercivity and saturation magnetic field indicate that nickel induces soft ferromagnetic properties in lead-iron-niobium-based compounds, and cobalt induces hard ferromagnetic properties. When a lead-iron-niobium-based compound is substituted with iron, PFFN10 shows that the magnetism is linearly dependent on the applied magnetic field, whereas PFFN20 does not show clear saturation within the applied maximum magnetic field level, and represents a hysteresis loop similar to ferromagnetism.

In addition, as the substitution of ferromagnetic elements increased in all compositions, the saturation magnetization value increased. The saturation magnetization is 0.5 emu/g at 10 mol % (PFFN10) and 3.5 emu/g at 20 mol % (PFFN20) when substituted with iron, and 2 emu/g at 10 mol % (PNFN10) when substituted with nickel. It was 3.3 emu/g at g and 20 mol % (PNFN20), and 3.4 emu/g at 10 mol % (PCFN10) and 6.5 emu/g at 20 mol % (PCFN20) when substituted with cobalt. The strong types of ferromagnetic ions, iron and cobalt, showed higher coercivity compared to the weaker types of nickel. The coercivity was 2500 Oe when replaced with iron, 60 Oe when replaced with nickel, and 300 Oe when replaced with cobalt.

As lead is replaced with ferromagnetic ions at the A-site at room temperature, it can be seen that the antiferromagnetic properties of the lead-iron-niobium-based compound are converted into ferromagnetic properties. Although the lead-iron-niobium-based compound substituted with iron has antiferromagnetic properties, compared to the Neel temperature of the lead-iron-niobium-based compound before substitution is 150K, it rapidly rises to 700K. On the other hand, when it is replaced with nickel, it has a high magnetic curie temperature of 850K, and when it is replaced with cobalt, it has a high magnetic curie temperature of 750K, so it can be seen that ferromagnetism is induced. In lead-iron-niobium-based compounds, a ferromagnetic moment is induced by nickel ions and cobalt ions substituted at the A-site, but is offset by iron at B-site. However, it was not induced by the iron ions substituted at the A-site.

Referring to the magnetic hysteresis loop of FIG. 6 and the temperature-dependent magnetization of FIG. 10 below, it is clear that nickel and cobalt induce ferromagnetic properties. In addition, the magnetic curie temperature of PNFN20 was 587° C. and the magnetic curie temperature of PCFN20 was 497° C. As expected from the case of ferrite having an inverse spinel structure, nickel substituted in a lead-iron-niobium-based compound induces soft ferromagnetic properties, and the substituted cobalt induces hard ferromagnetic properties. On the other hand, it can be seen that iron exhibits slightly different behavior from nickel and cobalt from the magnetic hysteresis loop. From the change of the magnetic hysteresis loop according to the increase of the iron content and the temperature-dependent magnetization result of FIG. 10, it can be seen that at least two magnetic properties of PFFN10 exist together. Even if iron, nickel, and cobalt are all ferromagnetic activating elements and are substituted at the same site with the same amount, the ferromagnetic properties expected for nickel and cobalt are not shown in the case of iron. Although the analysis of such different behaviors of iron is not yet clear, it is estimated that the spin moments of the same element located at different coordination numbers are offset each other through anti-equilibrium alignment of the spin, and this principle is based on nickel ferrite ($NiFe_2O_4$) is known.

Figure 7:
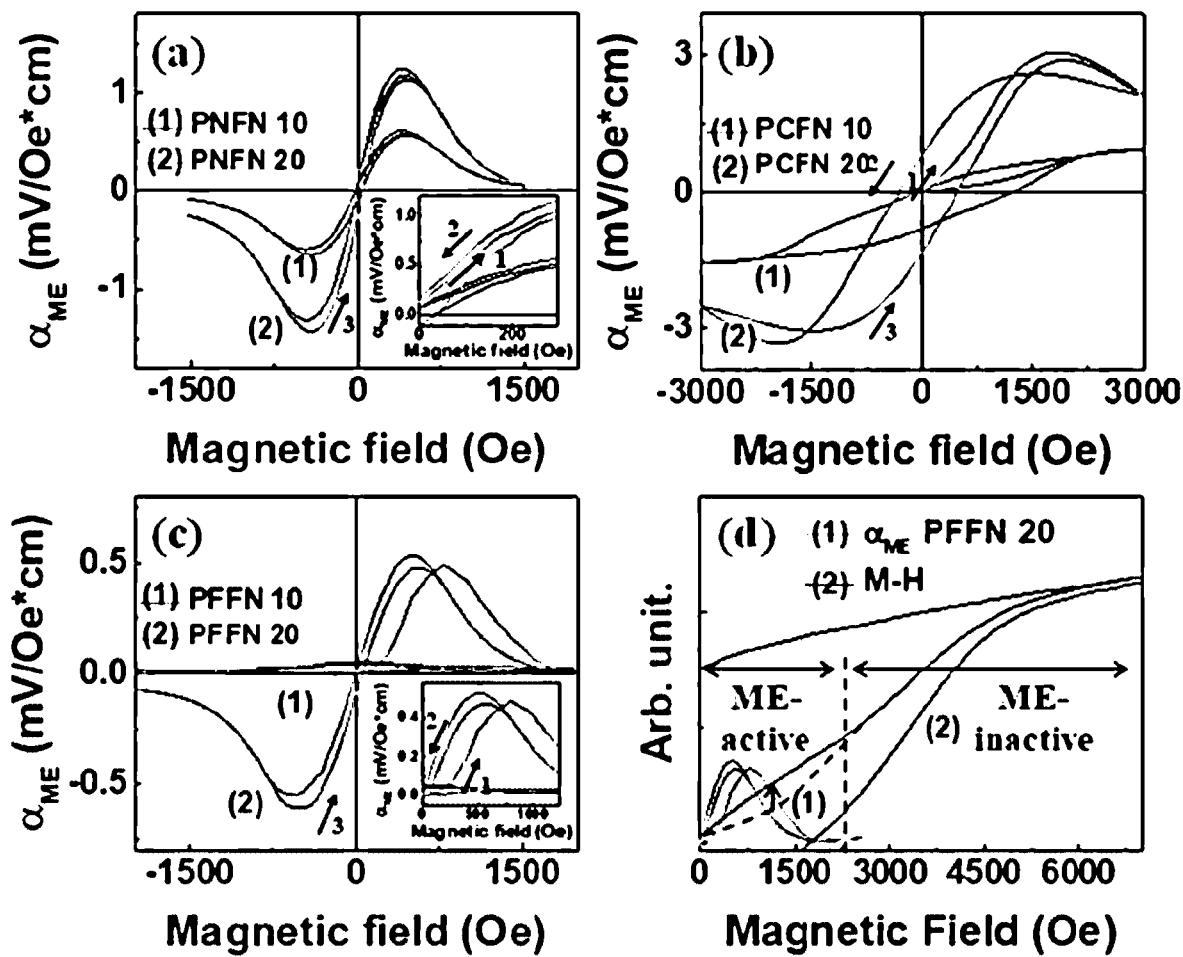
FIG. 7 is a graph showing magnetoelectric properties at room temperature of a room-temperature multiferroic material according to an embodiment of the present invention, wherein 7(a) is a case where lead is substituted with nickel, 7(b) is a case where lead is substituted with cobalt, and 7(c) and 7(d) are a case where lead is substituted with iron.

FIG. 7 is a graph showing magnetoelectric properties of a room-temperature multiferroic material at room temperature according to an embodiment of the present invention. In FIG. 7, (a) is a case where lead is substituted with nickel, (b) is a case where lead is substituted with cobalt, and (c) and (d) are a case where lead is substituted with iron.

Referring to FIG. 7, as a result of applying a magnetic field in the range of −1500 Oe to +1500 Oe to the lead-iron-niobium-based compound, a clear magnetoelectric coupling effect was observed depending on the magnetic field at room temperature, and there is a difference in values according to ferromagnetic elements. So far, no clear magnetoelectric coupling effect of ferromagnetic and ferroelectric properties has been reported in a bulk-scale single phase at room temperature. The relationship between the magnetic hysteresis loop and the magnetoelectric coupling effect of lead-iron-niobium-based compounds substituted with iron, nickel, and cobalt, respectively, is expressed as a coercive field ($\alpha_{ME}$). When nickel was substituted and cobalt was substituted, conventional ferromagnetic ferroelectric magnetoelectric coupling was shown together with hysteresis switching characteristics. In the case of iron substitution, the $\alpha_{ME}$ value in PFFN10 decreased as the magnitude of the magnetic field increased, and showed a maximum value of 0.05 mV/Oe cm near the zero magnetic field, which is commonly found in antiferromagnetic ferroelectric magnetoelectric materials. And, for example, there is a BFO. On the other hand, when x is 0.2 (i.e., PFFN20), the shape of $\alpha_{ME}$ was changed to a ferromagnetic ferroelectric magnetoelectric material. In (d) of FIG. 7, by comparison between magnetoelectric coupling and magnetization, it is analyzed that PFFN20 includes a magnetoelectrically coupled auxiliary phase and a non-magnetically coupled main phase.

Figure 11:
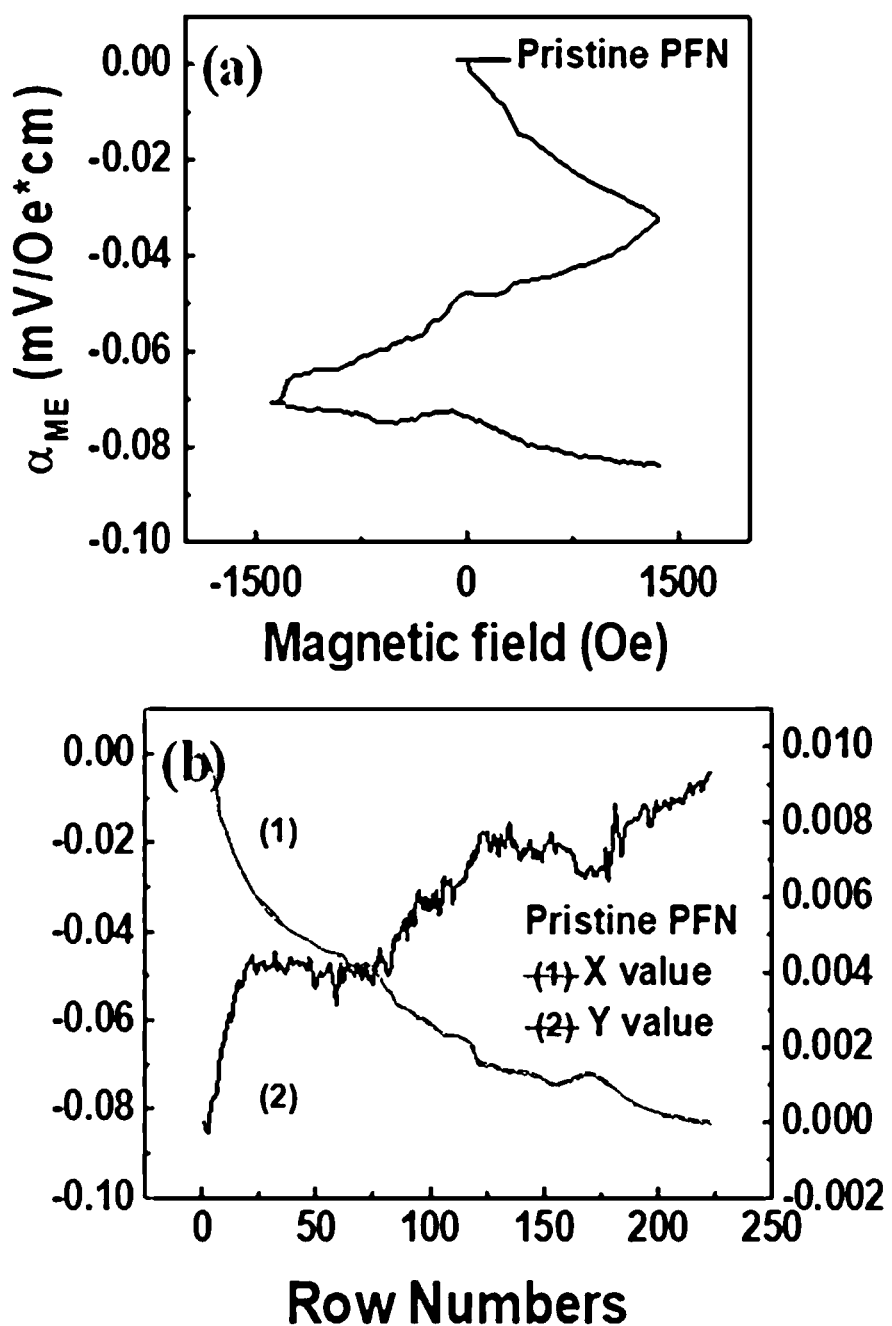
FIG. 11 is a graph showing a magnetoelectric voltage coefficient at room temperature of a lead-iron-niobium-based compound applied to a room-temperature multiferroic material according to an embodiment of the present invention, wherein 11(a) shows the lead-iron-niobium-based compound before the ferromagnetic material is substituted, and 11(b) shows a real value (X value) and an imaginary value (Y value) of the magnetic electric coefficient.

According to FIG. 7, it can be seen that a magnetoelectric bond that does not appear in a lead-iron-niobium-based compound in which a ferromagnetic element is not substituted is exhibited by a composition change regardless of the type of the substitution element, as shown in FIG. 11 below. In the case of nickel substitution, magnetoelectric coupling between ferromagnetism and ferroelectricity is well exhibited. The reason for this is that, first, $\alpha_{ME}$ increased with the increase of the magnetic field, and the magnetization induced at about 500 Oe is saturated and becomes a maximum. Second, the hysteresis in magnetoelectric coupling is because ferroelectric domains respond to external magnetic fields. Finally, it is because the magnetic field required to align randomly arranged ferromagnetic domains is smaller than that of switching. This description can be applied equally to the magnetoelectric coupling in the case where cobalt is substituted, but as expected from the M-H behavior, the $\alpha_{ME}$ size and the coercive force are different. The overshoot of $\alpha_{ME}$ while applying the magnetic field occurs because the magnetic field strength is not large enough for saturation.

On the other hand, in the case of substitution with iron, the magnetoelectric coupling exhibits a unique shape depending on the amount of iron. PFFN10 exhibits an inverted butterfly shape, which is commonly observed in antiferromagnetic ferroelectric BiFeO$_3$. When the iron content is 20 at. % (i.e., PFFN20), the shape of the magnetoelectric coupling changes to ferromagnetic ferroelectric magnetoelectric coupling, which is similar to the case of replacing with nickel or cobalt. Such ferromagnetic ferroelectric magnetoelectric coupling can be understood from a magnetic field dependent magnetization graph (M-H) in which the magnetoelectric coupling is superimposed, as shown in FIG. 7(d). When an external magnetic field is applied to the magnetically unpolarized PFFN20, the magnetization increases, and the magnetization speed decreases while reaching a magnetic field of 2000 Oe in the initial state. Then, the magnetization is normally increased with the increase of the magnetization speed. The abnormal behavior in the initial state can cover the entire magnetic field region for the existing ferromagnetic ferroelectric magnetoelectric coupling in PFFN20, which is referred to as an auxiliary phase, and the Neel temperature is about 663° C., and the abnormal behavior in the initial state may be a metastable antiferromagnetism in a non-polar state. It can be changed to ferromagnetic by the application of an external magnetic field. The phase transformation from antiferromagnetism to ferromagnetism induced by the magnetic field as described above can be well understood by the internal graph of FIG. 7(c). In PFFN20, the magnetic pole represented by path 1 requires a higher magnetic field compared to the switching of path 3, which is a different path from PNFN20 and PCFN20. On the other hand, in PFFN20, the main phase is a cause of most magnetic field induced magnetization and does not show the existing ferroelectricity and magnetoelectric coupling.

Figure 8:
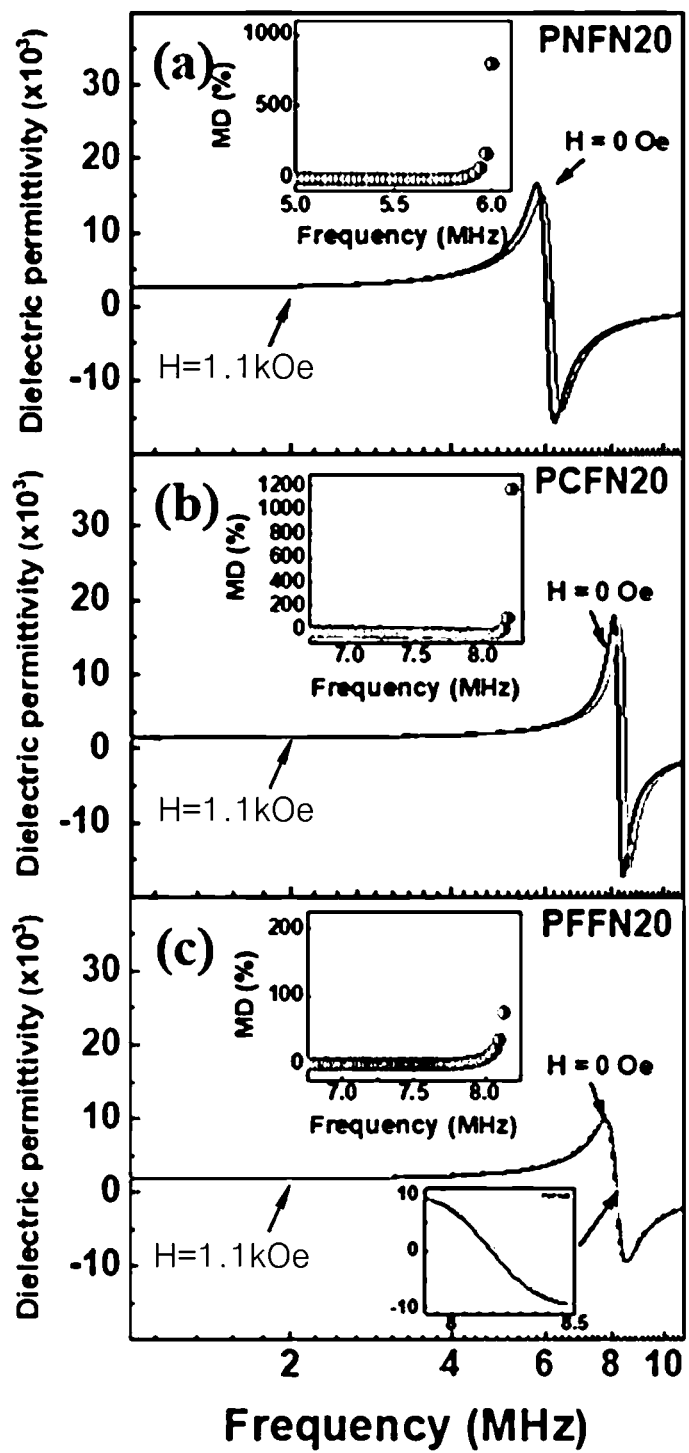
FIG. 8 is a graph showing a frequency-dependent dielectric constant of a room-temperature multiferroic material according to an embodiment of the present invention, wherein 8(a) is a case where lead is substituted with nickel, 8(b) is a case where lead is substituted with cobalt, and 8(c) is a case where lead is substituted with iron.

FIG. 8 is a graph showing a frequency-dependent dielectric constant of a room-temperature multiferroic material according to an embodiment of the present invention. In FIG. 8, (a) is a case where lead is substituted with nickel, (b) is a case where lead is substituted with cobalt, and (c) is a case where lead is substituted with iron.

Referring to FIG. 8, for a lead-iron-niobium-based compound in which 20 mol % of lead is respectively substituted with iron, nickel, and cobalt, when there is no magnetic field (0 Oe) and when a magnetic field of 1.1 kOe is applied, the resonant frequency and the magnitude of the dielectric constant change under a magnetic field, indicating magnetodielectric coupling. It can be seen that the magnetoelectric coupling is characterized by a frequency-dependent dielectric constant under a uniform magnetic field of 1.1 kOe. In all systems, the permittivity decreases under a magnetic field. The shape-dependent resonant frequencies are shifted to a higher frequency in all cases. This change was greatest in PCFN20 and the smallest in PFFN20. That is, PNFN20 changed from 6.00 MHz to 6.18 MHz, PCFN20 changed from 8.22 MHz to 8.49 MHz, and PFFN20 changed from 8.16 MHz to 8.19 MHz. The change of the resonant frequency under such a magnetic field was 797% at 6.00 MHz for PNFN20, 1175% at 8.22 MHz for PCFN20, and 75% at 8.16 MHz for PFFN20. It can be seen that by the specific composition design according to the present invention, the antiferromagnetic superexchange interaction generally found in oxide multiferroicity can be most effectively converted into a ferromagnetic superexchange interaction. The present invention can be easily applied to other systems and can achieve specific desired functionalities.

Figure 9:
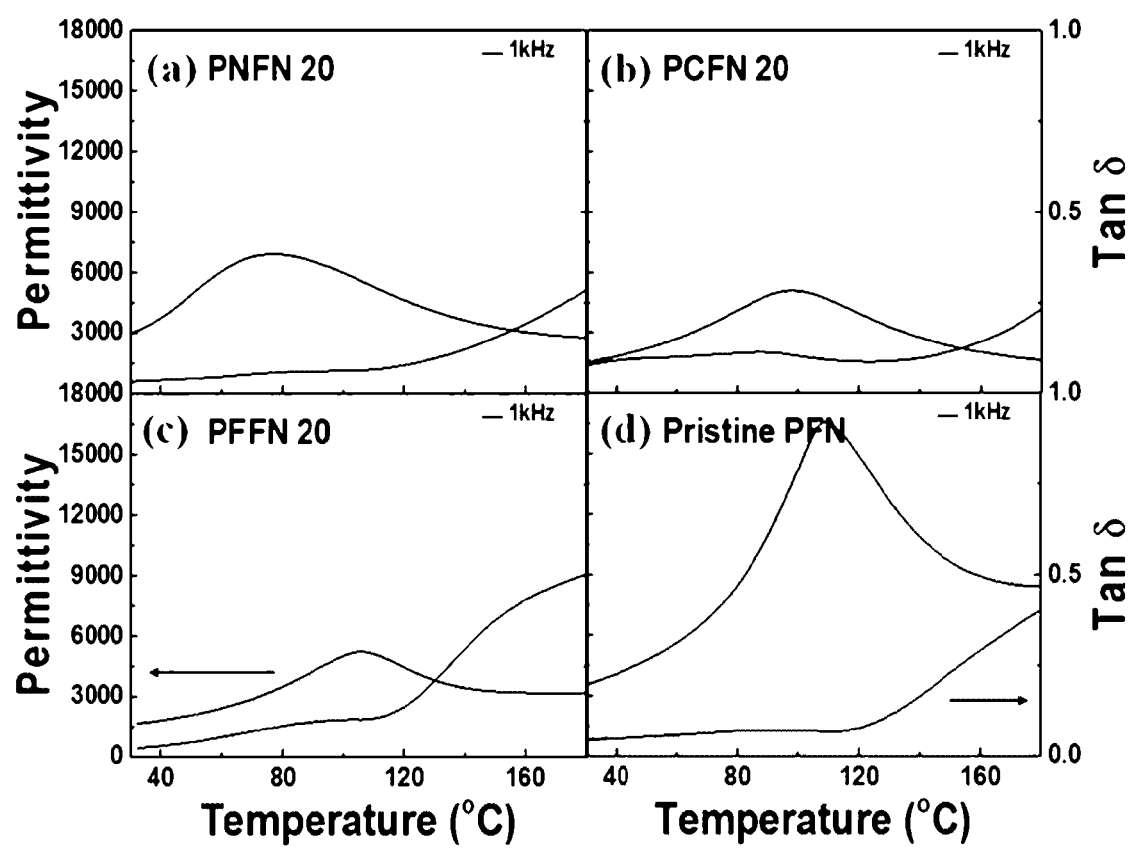
FIG. 9 is a graph showing temperature-dependent dielectric constant and dielectric loss of a room-temperature multiferroic material according to an embodiment of the present invention, wherein 9(a) is a case where lead is substituted with nickel, 9(b) is a case where lead is substituted with cobalt, 9(c) is a case where lead is substituted with iron, and 9(d) is a case of lead-iron-niobium-based compounds before they are substituted with a ferromagnetic material.

FIG. 9 is a graph showing temperature-dependent dielectric constant and dielectric loss of a room-temperature multiferroic material according to an embodiment of the present invention. In FIG. 9, (a) is a case where lead is substituted with nickel, (b) is a case where lead is substituted with cobalt, (c) is a case where lead is substituted with iron, and (d) is a case of lead-iron-niobium-based compounds before they are substituted with a ferromagnetic material.

Referring to FIG. 9, when a magnetic field of 1200 Oe is applied to a lead-iron-niobium-based compound in which lead is replaced with iron, nickel, and cobalt by 20 mol %, respectively, dielectric constant and dielectric loss appear at a frequency of kHz. The temperature-dependent permittivity exhibits typical ferromagnetic properties with diffused phase transformation. The lead-iron-niobium compound before substitution has a maximum dielectric constant of about 114° C., about 78° C. when it is substituted with nickel, about 102° C. when it is substituted with cobalt, and about 107° C. when it is substituted with iron. Thus, it can be seen that the temperature has been reduced by the substitution. The temperature was found to be independent of the measurement frequency, and it was analyzed that the dielectric constant behavior having a diffusion-type characteristic did not depend on relaxer ferroelectricity, unlike conventionally known ones.

Figure 10:
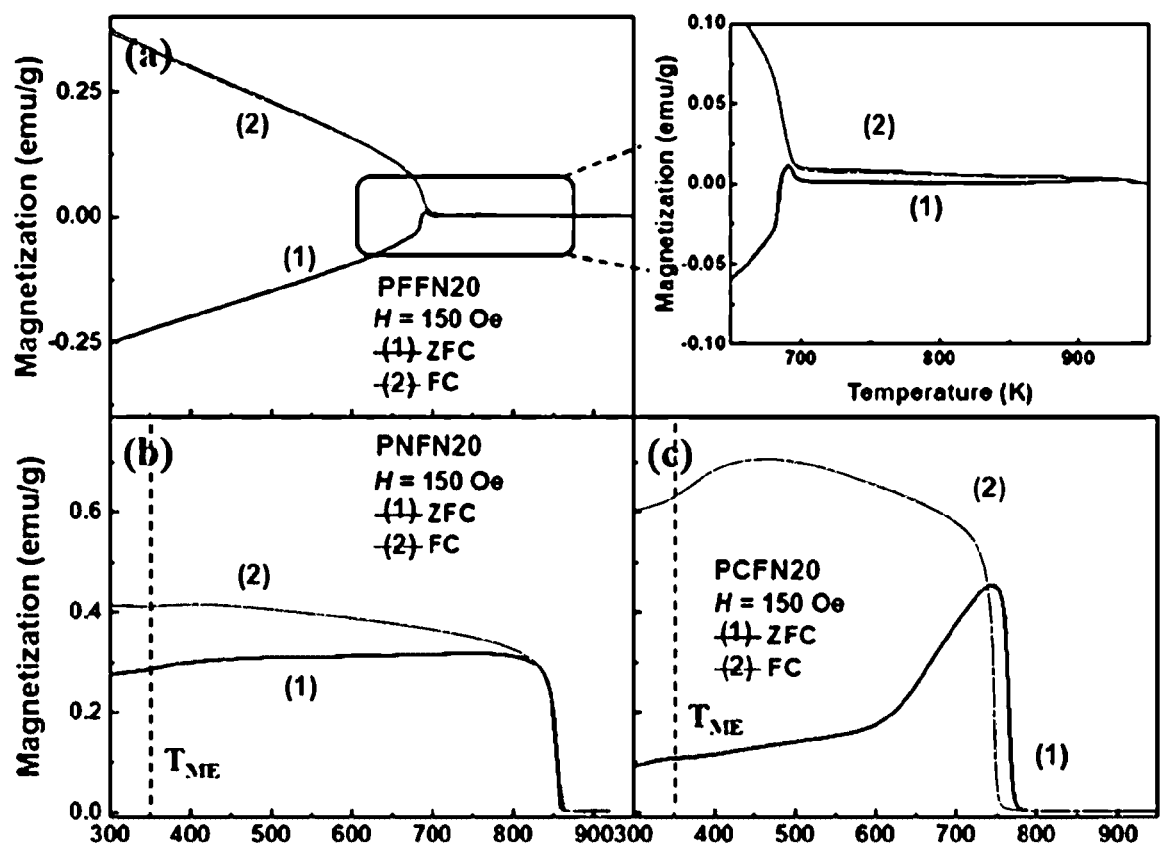
FIG. 10 is a graph showing magnetic properties of a room-temperature multiferroic material according to temperature according to an embodiment of the present invention, wherein 10(a) is a case where lead is substituted with iron, 10(b) is a case where lead is substituted with nickel, and 10(c) is a case where lead is substituted with cobalt.

FIG. 10 is a graph showing magnetic properties of a room-temperature multiferroic material according to temperature according to an embodiment of the present invention. In FIG. 10, (a) is a case where lead is substituted with iron, (b) is a case where lead is substituted with nickel, and (c) is a case where lead is substituted with cobalt.

Referring to FIG. 10, when a magnetic field of 150 Oe is applied to a lead-iron-niobium-based compound in which 20 mol % of lead is respectively substituted with iron, nickel, and cobalt, field cooling (FC) and no magnetic field temperature-dependent magnetization of a lead-iron-niobium-based compound in which the A-site for zero field cooling (ZFC) is substituted with a ferromagnetic element is shown. When it is substituted with iron, it exhibits antiferromagnetic properties, and in particular, the Neel temperature is significantly increased. When substituted with nickel, it exhibits soft ferromagnetic properties. When substituted with cobalt, it exhibits hard ferromagnetic properties. A magnetoelectric coupling transition point ($T_{ME}$) is expected to be the loss point of magnetoelectric properties. In the case of nickel substitution, the magnetoelectric coupling transition point was about 72° C., and the curie temperature was about 587° C. In the case of substitution with cobalt, the magnetoelectric coupling transition point was about 94° C., and the Curie temperature was about 497° C. In the case of substitution with iron, a series of transitions appeared, which means that it has at least two magnetic properties. The first transition occurred at about 663° C., followed by transitions at about 565° C. and 420° C. The magnitude of magnetization at each transition shows that the transition at 420° C. belongs to the main phase in PFFN20.

FIG. 11 is a graph showing a magnetoelectric voltage coefficient of a lead-iron-niobium-based compound applied to a room-temperature multiferroic material at room temperature according to an embodiment of the present invention.

Referring to FIG. 11, as shown in (a), the lead-iron-niobium-based compound before the ferromagnetic material is substituted, does not exhibit ferromagnetic properties at room temperature and exhibits a negative value. In addition, as shown in (b), a real value (X value) and an imaginary value (Y value) of the magnetic electric coefficient are shown.

While the present invention has been particularly shown and described with reference to exemplary embodiments thereof, it will be understood by those of ordinary skill in the art that various changes in form and details may be made therein without departing from the spirit and scope of the present invention as defined by the following claims.

INDUSTRIAL APPLICABILITY

By using the present invention, a ferromagnetic element-substituted room-temperature multiferroic material can be manufactured.

The invention claimed is:

1. A ferromagnetic element-substituted room-temperature multiferroic material comprising a compound of the following chemical formula 1:

$$(Pb_{1-x}M_x)Fe_{1/2}Nb_{1/2}O_3, \qquad <\text{chemical formula 1}>$$

where M represents a ferromagnetic element, and x is from 0.1 to 0.2,
wherein the room-temperature multiferroic material:
is composed of a single phase;
has a polycrystalline bulk shape; and
has an $ABO_3$ perovskite structure,
wherein a material at A-site of the $ABO_3$ perovskite structure is substituted by the ferromagnetic element so that 180-degreee superexchange interaction changes to 90-degree interaction,
wherein the room-temperature multiferroic material has a higher saturation magnetization and a higher magnetoelectric coefficient than that of $PbFe_{1/2}Nb_{1/2}O_3$,
wherein the room-temperature multiferroic material has ferromagnetism and ferroelectricity.

2. The ferromagnetic element-substituted room-temperature multiferroic material of claim 1, wherein, in chemical formula 1, M comprises iron (Fe), nickel (Ni), or cobalt (Co).

3. A method for manufacturing a ferromagnetic element-substituted room-temperature multiferroic material, the method comprising:
mixing a lead oxide, an iron oxide, a niobium oxide, and a ferromagnetic element to form a mixture;
calcinating the mixture; and
sintering the mixture to form a room-temperature multiferroic material,
wherein the ferromagnetic element-substituted room-temperature multiferroic material comprises a compound of the following chemical formula 1:

$$(Pb_{1-x}M_x)Fe_{1/2}Nb_{1/2}O_3, \qquad <\text{chemical formula 1}>$$

where M represents a ferromagnetic element, and x is from 0.1 to 0.2,
wherein the room-temperature multiferroic material:
is composed of a single phase;
has a polycrystalline bulk shape; and
has an $ABO_3$ perovskite structure,
wherein a material at A-site of the $ABO_3$ perovskite structure is substituted by the ferromagnetic element so that 180-degreee superexchange interaction changes to 90-degree interaction,
wherein the room-temperature multiferroic material has a higher saturation magnetization and a higher magnetoelectric coefficient than that of $PbFe_{1/2}Nb_{1/2}O_3$,
wherein the room-temperature multiferroic material has ferromagnetism and ferroelectricity.

4. The method of claim 3, between the forming of the mixture and the calcinating, further comprising first ball-milling the mixture.

5. The method of claim 3, between the calcinating of the mixture and the sintering the mixture to form a room-temperature multiferroic material, further comprising second ball-milling the mixture.

6. The method of claim 3, before the sintering of the mixture to form a room-temperature multiferroic material, further comprising pressurizing the mixture to form pellets.

7. The method of claim 3, wherein the calcinating is performed at a temperature in a range of 600° C. to 850° C. in a range of 1 hour to 6 hours.

8. The method of claim 3, wherein the sintering to form a room-temperature multiferroic material is performed at a temperature in a range of 950° C. to 1150° C. in a range of 1 hour to 16 hours.

9. The method of claim 3, wherein the calcinating and the sintering to form a room-temperature multiferroic material are performed in air or at an inert atmosphere.

10. The method of claim 3, wherein the lead oxide comprises PbO, the iron oxide comprises $Fe_2O_3$, and the niobium oxide comprises $Nb_2O_5$.

11. The method of claim 3, wherein the ferromagnetic element comprises at least one of iron, nickel, and cobalt.

12. The method of claim 3, wherein the ferromagnetic element is composed of at least one of $Fe_2O_3$, NiO, and $CoCO_3$.

* * * * *